(12) United States Patent
Ebbecke

(10) Patent No.: US 12,308,603 B2
(45) Date of Patent: May 20, 2025

(54) ENVIRONMENT SENSOR, MEASURING DEVICE AND METHOD FOR OPERATING A MEASURING DEVICE

(71) Applicant: ams-OSRAM International GmbH, Regensburg (DE)

(72) Inventor: Jens Ebbecke, Rohr in Niederbayern (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 180 days.

(21) Appl. No.: 18/044,416

(22) PCT Filed: Aug. 26, 2021

(86) PCT No.: PCT/EP2021/073633
§ 371 (c)(1),
(2) Date: Mar. 8, 2023

(87) PCT Pub. No.: WO2022/053326
PCT Pub. Date: Mar. 17, 2022

(65) Prior Publication Data
US 2023/0378715 A1    Nov. 23, 2023

(30) Foreign Application Priority Data

Sep. 9, 2020    (DE) .......................... 102020123477.5

(51) Int. Cl.
*H01S 5/00* (2006.01)
*G01N 21/41* (2006.01)
(Continued)

(52) U.S. Cl.
CPC ........... *H01S 5/0028* (2013.01); *G01N 21/41* (2013.01); *H01S 5/028* (2013.01); *H01S 5/1071* (2013.01); *H01S 5/0282* (2013.01)

(58) Field of Classification Search
CPC ...... H01S 5/0028; H01S 5/1071; H01S 5/028; H01S 5/0282; G01N 21/41; B81B 2201/0264; B81B 2201/0278
(Continued)

(56) References Cited

U.S. PATENT DOCUMENTS

| 5,099,350 A | 3/1992 | Hisao |
| 7,749,748 B2 | 7/2010 | Kiesel et al. |
| 2023/0192477 A1* | 6/2023 | Jin .......................... H04R 13/00 324/207.22 |

FOREIGN PATENT DOCUMENTS

| DE | 112008002059 B4 | 11/2013 |
| DE | 102015108529 A1 | 12/2016 |
| KR | 101896180 B1 | 9/2018 |

OTHER PUBLICATIONS

International Search Report and Written Opinion dated Nov. 29, 2021, PCT Application No. PCT/EP2021/073633, with English language translation, 19 pages.
(Continued)

*Primary Examiner* — Hoa Q Pham
(74) *Attorney, Agent, or Firm* — MH2 Technology Law Group LLP

(57) ABSTRACT

In at least one embodiment, the environment sensor for sensing at least one environment parameter includes a semiconductor layer sequence, a sheath, the index of refraction of which changes as a function of the environment parameter, and a first electrical contact and a second electrical contact for supplying current to the semiconductor layer sequence. The semiconductor layer sequence has the shape of a generalized cylinder having a main axis. In directions perpendicular to the main axis, the semiconductor layer sequence is at least partly covered by the sheath. The semiconductor layer sequence has an index of refraction which is greater than the index of refraction of the sheath.

(Continued)

The semiconductor layer sequence is designed to form laser modes within the environment sensor. Furthermore, the environment sensor is designed such that, in its normal operation, a change in the index of refraction of the sheath causes a change in the electrical resistance of the semiconductor layer sequence as a result of a change in radiation losses within the semiconductor layer sequence.

16 Claims, 4 Drawing Sheets

(51) Int. Cl.
 *H01S 5/028* (2006.01)
 *H01S 5/10* (2021.01)
(58) Field of Classification Search
 USPC ............. 356/128–137, 432–440; 385/14, 50; 257/22
 See application file for complete search history.

(56) References Cited

OTHER PUBLICATIONS

German Search Report dated Mar. 31, 2021, DE Application No. 10 2020 123 477.5, 5 pages.

Backes, S.A., "Threshold reduction in pierced microdisk lasers", Applied Physics Letters, Jan. 11, 1999, 3 pages, vol. 74, No. 2.

Behringer, M., "High-Power Diode Laser Technology and Characteristics", Springer Series in Optical Sciences, Jan. 2007, vol. 128.

Henari, F.Z., "The Influence of pH on Nonlinear Refractive Index of Bromophenol Blue", Science Publications, Physics International, 2010, vol. 1, No. 1, pp. 27-30.

Jiang, X., "Whispering-Gallery Microresonators for Sensing Technologies", Chemical, Biological, Radiological, Nuclear, and Explosives (CBRNE), 2018, 7 pages, vol. 10629.

Levi, A. F., "Room temperature operation of a sub-micron radius disk laser", Electronics Letters, 1993, vol. 29, pp. 1666-1667.

Mitsuhashi, Y., "Voltage Change Across the Self-Coupled Semiconductor Laser", Jul. 1981, 1216 IEEE Journal of Quantum Electronics, vol. QE-17, No. 7.

Sahai, A. A., "Mapping the nonlinear dynamics of a laser diode via its terminal voltage", Optics Letters, Oct. 1, 2014, vol. 39, No. 19.

Shlyagina, M.G., "Incident-power-dependent refractive index of ferrofluid in magnetic field measured with a fiber optic probe", Optik—International Journal for Light and Electron Optics, Feb. 25, 2019, pp. 418-422, vol. 186.

Wong, W., "Polyvinyl alcohol coated photonic crystal optical fiber sensor for humidity measurement", Sensors and Actuators, 2012, pp. 563-569, vol. B 174.

Yin, B., "Wavelength-and Intensity-Demodulated Dual-Wavelength Fiber Laser Sensor for Simultaneous RH and Temperature Detection", IEEE Access, Mar. 9, 2020, 9 pages, vol. 8.

* cited by examiner

ENVIRONMENT SENSOR, MEASURING DEVICE AND METHOD FOR OPERATING A MEASURING DEVICE

CROSS-REFERENCE TO RELATED APPLICATIONS

This patent application is a national stage entry from International Application No. PCT/EP2021/073633, filed on Aug. 26, 2021, published as International Publication No. WO 2022/053326 A1 on Mar. 17, 2022, and claims priority to German patent application 10 2020 123 477.5, filed Sep. 9, 2020, the entire contents of all of which are incorporated by reference herein.

FIELD

An environment sensor is specified. In addition, a measuring device and a method for operating a measuring device are specified.

BACKGROUND

One object to be achieved is, among other things, to specify an environment sensor which can be made particularly compact and has a high sensitivity. A further object to be achieved is, among other things, to specify a measuring device which comprises such an environment sensor in order to measure an environment parameter. A further object to be achieved is, among other things, to specify a method for operating such a measuring device.

These objects are achieved by the subjects or methods of the independent claims. Advantageous embodiments and refinements are the subject matter of the respective dependent claims.

The environment sensor described here is suitable in particular for sensing at least one environment parameter. If the environment sensor is used, for example, as part of a measuring device, in particular a measuring device described here, the value of the at least one environment parameter may be ascertained.

SUMMARY

According to at least one embodiment of the environment sensor, it comprises a semiconductor layer sequence. For example, the semiconductor layer sequence comprises a p-conducting area and an n-conducting area and an active zone arranged between these two areas. The active zone is used to generate electromagnetic radiation. The active zone contains in particular at least one quantum well structure in the form of a single quantum well, abbreviated SQW, or in the form of a multiple quantum well structure, abbreviated MQW. In addition, the active zone contains one, preferably multiple secondary well structures. For example, electromagnetic radiation in the blue or green or red spectral range or in the UV range or in the IR range is generated in the active zone in the intended operation.

For example, the semiconductor layer sequence is based on a nitride compound semiconductor material, for example, $Al_nIn_{1-n-m}Ga_mN$, or on a phosphide compound semiconductor material, for example, $Al_nIn_{1-n-m}Ga_mP$, or on an arsenide compound semiconductor material, for example, $Al_nIn_{1-n-m}Ga_mAs$, wherein in each case $0 \leq n \leq 1$, $0 \leq m \leq 1$, and $m+n \leq 1$. The semiconductor layer sequence can include dopants and additional components. For the sake of simplicity, however, only the essential components of the crystal lattice of the semiconductor layer sequence, thus Al, As, Ga, In, N, or P, are specified, although these can be partially replaced and/or supplemented by small amounts of further materials.

According to at least one embodiment of the environment sensor or its above-described embodiment, the environment sensor comprises a sheath. The sheath is formed in particular using a material, the index of refraction of which changes as a function of an environment parameter. In particular, the value of the environment parameter may be ascertained uniquely from the index of refraction of the sheath. The sheath is formed, for example, using a dielectric material. All indices of refraction which are mentioned here and hereinafter relate in particular to the radiation generated in the active zone at an operating temperature of the environment sensor.

According to at least one embodiment of the environment sensor or one of its above-described embodiments, it comprises a first electrical contact and a second electrical contact for energizing the semiconductor layer sequence. The electrical contacts are arranged in particular on opposing outer surfaces of the semiconductor layer sequence, wherein the outer surfaces extend in parallel to the main extension plane of the semiconductor layer sequence and/or the active zone. The electrical contacts are formed, for example, using one of the following materials or using a mixture of the following materials: Au, Ag, Al, Ti.

According to at least one embodiment of the environment sensor or one of its above-described embodiments, the semiconductor layer sequence has the shape of a general cylinder having a main axis. The main axis in particular extends perpendicularly to a main extension plane of the semiconductor layer sequence. In particular, the main axis extends perpendicularly to a main extension plane of the active zone.

"General cylinder" in particular means the term in the mathematical meaning. A general cylinder is accordingly formed from a geometrical base surface and a geometrical cover surface, wherein the cover surface results from a parallel displacement of the base surface. In particular, the base surface and the cover surface are congruent in the direction of the main axis. That is to say, the parallel displacement preferably takes place in the direction of the main axis. A lateral surface of the general cylinder connects the base surface and the cover surface to one another.

For example, the semiconductor layer sequence has the geometric shape of a right circular cylinder. For example, the semiconductor layer sequence is then circular in a top view. In particular, the main axis is an axis of rotational symmetry of the semiconductor layer sequence. In a right circular cylinder, both the base surface and the cover surface are formed from a circular disk. A top view means here and hereinafter a view of the semiconductor layer sequence in the direction of the main axis.

According to at least one embodiment of the environment sensor or one of its above-described embodiments, the semiconductor layer sequence is at least partially covered by the sheath in the direction perpendicular to the main axis. The semiconductor layer sequence is preferably completely covered by the sheath in these directions. That is to say, in a top view, the sheath in particular completely encloses the semiconductor layer sequence.

According to at least one embodiment of the environment sensor or one of its above-described embodiments, the semiconductor layer sequence has an index of refraction which is greater than the index of refraction of the sheath. "Index of refraction of the semiconductor layer sequence"

relates in particular to an average index of refraction of the semiconductor layer sequence.

Alternatively, "the semiconductor layer sequence has an index of refraction" means that a layer, for example the active layer, or an area of the semiconductor layer sequence, for example a mode-guiding area, has a corresponding index of refraction.

For example, a difference in the index of refraction between the semiconductor layer sequence and the sheath, also referred to as the index of refraction difference hereinafter, is at least 0.1% and at most 1%. In particular also for the case that the index of refraction of the sheath changes, the index of refraction difference is still present in this order of magnitude. For example, the difference in the index of refraction is $1 \times 10^{-3}$.

According to at least one embodiment of the environment sensor or one of its above-described embodiments, the semiconductor layer sequence is configured to form laser modes within the environment sensor. For example, so-called ring modes, also referred to as whispering gallery modes in English, are generated in the semiconductor layer sequence. These modes run along a boundary surface between the semiconductor layer sequence and the sheath. Due to total reflection at this boundary surface, the modes are amplified within the semiconductor layer sequence and laser modes are formed. In particular, in the intended operation, a current is applied to the semiconductor layer sequence via the electrical contacts, which pumps the semiconductor layer sequence and excites the laser modes. A fundamental functional principle and examples of semiconductor laser diodes which form ring modes are described, for example, in document DE 102015108529 A1, the contents of the disclosure of which in this regard is hereby incorporated by reference.

According to at least one embodiment of the environment sensor or one of its above-described embodiments, the environment sensor is configured so that in its intended operation, a change of the index of refraction of the sheath causes a change of the electrical resistance of the semiconductor layer sequence due to a change of the radiation losses within the semiconductor layer sequence. In other words, the electrical resistance of the semiconductor layer sequence or the environment sensor is a function of the environment parameter. Since in intended operation the generated laser modes in particular run along the boundary surface between the semiconductor layer sequence and the sheath and the generation of the laser modes is based on the total reflection occurring at the boundary surface, the index of refraction of the sheath has significant influence on radiation losses within the semiconductor layer sequence.

In at least one embodiment, the environment sensor for sensing at least one environment parameter comprises a semiconductor layer sequence, a sheath, the index of refraction of which changes as a function of the environment parameter, and a first electrical contact and a second electrical contact, which are used in particular for energizing the semiconductor layer sequence. The semiconductor layer sequence has the shape of a general cylinder having a main axis. In the direction perpendicular to the main axis, the semiconductor layer sequence is at least partially covered by the sheath. The semiconductor layer sequence has an index of refraction which is greater than the index of refraction of the sheath. The semiconductor layer sequence is configured to form laser modes within the environment sensor. Furthermore, the environment sensor is configured so that in its intended operation, a change of the index of refraction of the sheath causes a change of the electrical resistance of the semiconductor layer sequence due to a change of the radiation losses within the semiconductor layer sequence.

An environment sensor described here is based, among other things, on the following technical special features. To implement a particularly sensitive environment sensor, a cylindrical semiconductor layer sequence is sheathed using a material, the index of refraction of which reacts to changes of the environment. A ring mode formed in the semiconductor layer sequence is guided within the semiconductor layer sequence by total reflection at a boundary surface between the semiconductor layer sequence and the sheath. Upon the total reflection, a part of the reflected laser radiation penetrates as an evanescent field into the sheath. Among other things, the index of refraction of the sheath thus influences the laser mode within the semiconductor layer sequence. In particular, optical properties are influenced. For example, the frequency can shift at which the laser radiation has its maximum intensity, or a resonance of the laser radiation is split into two resonances. These changes can be used as a measurement signal. An evaluation of the optical properties of the laser radiation, for example, with the aid of a spectrometer, is conventionally necessary for this purpose. Such a measuring method is described, for example, in document U.S. Pat. No. 7,749,748 B2, the contents of the disclosure of which is hereby incorporated by reference.

The documents of Behringer M. (2007) High-Power Diode Laser Technology and Characteristics. In: Bachmann F., Loosen P., Poprawe R. (eds) High Power Diode Lasers. Springer Series in Optical Sciences, vol 128. Springer, New York, NY and Y. Mitsuhashi et al., IEEE J. of Quantum Electronics 17, 1216, 1981, and A. A. Sahai et al., Optic Letters 39, 5630, 2014, describe, for example, that an electrical resistance of a conventional semiconductor laser diode is a function of the reflectivity of resonator end faces.

The environment sensor described here makes use of the concept, among other things, of utilizing a functional relationship between an environment parameter and the electrical resistance of the semiconductor layer sequence or of the environment sensor as a measured variable. A change of an environment parameter may thus be ascertained via the electrical resistance of the environment sensor.

Due to the change of the index of refraction of the sheath, the condition for total reflection at a boundary surface between the semiconductor layer sequence and the sheath changes, due to which radiation losses within the semiconductor layer sequence change. This causes a change of the electrical resistance of the semiconductor layer sequence. There is therefore a direct relationship with a change of an environment parameter and a voltage drop measured at the semiconductor layer sequence in the case of a constant current supply. If a functional relationship, in particular a one-to-one relationship, exists between the environment parameter and the electrical resistance, absolute values of the environment parameter can also be sensed on the basis of a calibration of the environment sensor, for example.

Advantageously, a further readout device, such as a spectrometer, is not required in an environment sensor described here. In addition, cylindrical semiconductor laser diodes can advantageously be made particularly compact. A further advantage results in that due to the sheath arranged on a lateral surface of the general cylinder, a particularly large proportion of the outer surface of the ambient sensor reacts sensitively to a change of the environment.

According to at least one embodiment of the environment sensor or one of its above-described embodiments, the environment parameter is one of the following parameters:

temperature, pressure, humidity, light intensity, magnetic field strength, pH value. For example, the index of refraction of the sheath changes due to a change of one of these parameters. In particular, precisely one value of the index of refraction of the sheath is associated with a specific temperature value, pressure value, humidity value, a specific light intensity, magnetic field strength, and/or a pH value. In other words, a unique relationship exists between the environment parameter and the index of refraction of the sheath, and thus in particular the electrical resistance of the environment sensor.

According to at least one embodiment of the environment sensor or one of its abovementioned embodiments, the sheath includes at least one of the following materials: bromophenol blue, polyvinyl alcohol, $Fe_3O_4$ ferrofluid, lithium niobate, AlGaN.

For example, bromophenol blue reacts to a change of the pH value with a change of the index of refraction. Polyvinyl alcohol reacts in particular to a change of the humidity, for example the ambient humidity of the ambient air of the environment sensor, with a change of the index of refraction. The index of refraction of $Fe_3O_4$ ferrofluid is, for example, a function of the light intensity and/or the magnetic field strength. For example, the index of refraction of lithium niobate displays a strong dependence on the temperature, for example the ambient temperature. The index of refraction of AlGaN is dependent, for example, on a pressure, for example an ambient pressure. Radiation which is generated in operation in the environment sensor is preferably not absorbed by AlGaN.

According to at least one embodiment of the environment sensor or one of its above-described embodiments, the functional relationship between the index of refraction of the sheath and the at least one environment parameter is linear. For example, the index of refraction is a linear function of the environment parameter to be sensed.

According to at least one embodiment of the environment sensor or one of its above-described embodiments, a side of the sheath facing away from the semiconductor layer sequence directly adjoins the environment to be monitored. This means in particular that the sheath is exposed to the outside, thus no further materials and/or layers are arranged between the sheath and the environment having the at least one environment parameter. The environment parameter can thus advantageously be sensed particularly well, since environmental influences can be registered directly by the sheath. The sensitivity of the environment sensor may be increased in particular by a sheath exposed to the outside for ascertaining temperature, ambient pressure, and humidity as well as the pH value.

According to at least one embodiment of the environment sensor or one of its above-described embodiments, a passivation layer is arranged on a side of the sheath facing away from the semiconductor layer sequence. In particular the sheath may be protected by the passivation layer. The passivation layer preferably has no effects on the environment parameter which is to be seen by the sheath. For example, a light intensity and/or a magnetic field strength come into consideration as such environment parameters. The passivation layer is in this case preferably transmissive to ambient light and/or magnetic fields. The passivation layer has, for example, a thickness measured perpendicularly to the main axis between 1 nm and 100 nm inclusive. The passivation layer is formed, for example, using an oxide, such as silicon oxide or aluminum oxide, or a nitride, such as silicon nitride.

According to at least one embodiment of the environment sensor or one of its above-described embodiments, the sheath has a thickness of at least 1 nm and at most 1 µm. In particular, the sheath has a thickness between 10 nm inclusive and 200 nm inclusive. The thickness is preferably between 90 nm inclusive and 110 nm inclusive. The thickness is measured in particular in the direction perpendicular to the main axis.

According to at least one embodiment of the environment sensor or one of its above-described embodiments, the semiconductor layer sequence has the shape of a prism. In particular, the environment sensor has the shape of a prism. The semiconductor layer sequence and/or the environment sensor each have the shape of a regular polygon in a top view, for example. The regular polygon in particular has at least five or at least six or at least eight corners. The prism is in particular a general cylinder, in which the base surface and the cover surface are formed from a regular polygon. In particular, any prism is conceivable for the semiconductor layer sequence which can form ring modes in the interior of the semiconductor layer sequence. If the semiconductor layer sequence is based, for example, on an InGaN material system, a semiconductor layer sequence may thus be implemented particularly easily in the form of a prism having a hexagon as a base surface.

According to at least one embodiment of the environment sensor or one of its above-described embodiments, the environment sensor has an extension of at most 1000 µm or at most 20 µm or at most 5 µm perpendicular to the main axis. Alternatively or additionally, the extension is at least 500 nm or at least 1 µm or at least 5 µm. In the case of a semiconductor layer sequence in the form of a right circular cylinder, the extension is defined in particular by the diameter of the environment sensor. An axis along which the extension is measured preferably extends through the main axis. The extension is in particular a maximum extension of the semiconductor layer sequence.

According to at least one embodiment of the environment sensor or one of its above-described embodiments, the semiconductor layer sequence comprises a mode-guiding area. The mode-guiding area in particular includes the active zone of the semiconductor layer sequence, which is configured to generate electromagnetic radiation. Furthermore, the mode-guiding area is preferably spaced apart in each case from the first electrical contact and the second contact. In particular, the mode-guiding area comprises a first waveguide layer and a second waveguide layer, between which the active zone is arranged. In particular, radiation which is generated in the active zone is guided within the mode-guiding area. For example, the mode-guiding area delimits the propagation of the radiation in a direction parallel to the main axis. For this purpose, areas of the semiconductor layer sequence which delimit the mode-guiding area in the direction of the main axis preferably have a lower index of refraction than the mode-guiding area.

An interfering influence of the electrical contacts or the outer surfaces on which the electrical contacts are arranged on the laser mode in the mode-guiding area may advantageously be reduced by the distance of the mode-guiding area to the electrical contacts.

According to at least one embodiment of the environment sensor or its embodiment just described, the mode-guiding area has a greater extension in the direction perpendicular to the main axis than the rest of the semiconductor layer sequence. The influence of the electrical contacts or the cover surface and the base surface of the semiconductor layer sequence may thus advantageously be reduced further.

According to at least one embodiment of the environment sensor or one of its above-described embodiments, the environment sensor includes a substrate. The substrate is in particular arranged between the semiconductor layer sequence and the first electrical contact. The substrate is preferably formed from an electrically conductive material. The substrate comprises, for example, Si or GaAs or is formed from one of these materials. The substrate is, for example, a growth substrate of the semiconductor layer sequence. Because the semiconductor layer sequence remains on the growth substrate, the environment sensor is relatively simple and cost-effective to produce.

Furthermore, a measuring device for ascertaining the value of at least one environment parameter is specified. The measuring device comprises an environment sensor, in particular an environment sensor according to one of the above-described embodiments. That is to say, all features disclosed for the environment sensor are also disclosed for the measuring device and vice versa.

According to at least one embodiment of the measuring device, the measuring device comprises a current source which is configured to apply a constant current to the semiconductor layer sequence via the electrical contacts. Furthermore, the measuring device comprises a voltmeter, which is coupled to the environment sensor and is configured to measure an electrical voltage drop at the environment sensor. Due to the constant current supply, an electrical resistance of the environment sensor may be ascertained by means of the voltmeter.

The measuring device furthermore comprises an evaluation device, which is configured to assign, for example, to calculate, the value of the environment parameter to be ascertained from a voltage drop measured by the voltmeter. For example, it is stored in the evaluation device how a functional relationship between the voltage drop, which occurs due to the dependence of the index of refraction of the sheath on the environment parameter, relates to the at least one environment parameter. Precisely one value of the environment parameter is preferably assigned to each value of the voltage drop and vice versa. This is therefore in particular a bijective or one-to-one relationship between the environment parameter and the voltage drop.

Furthermore, a method for operating a measuring device is specified. The measuring device can in particular be a measuring device described here having an environment sensor described here. That is to say, all features disclosed for the measuring device and/or the environment sensor are also disclosed for the method and vice versa.

In the method for operating a measuring device, a constant current is applied to the environment sensor, which results in the generation of laser modes in the semiconductor layer sequence. A current is applied in such a way that in particular a current density in the semiconductor layer sequence is sufficient to operate the semiconductor layer sequence above a laser threshold. Current is preferably applied at a constant value in the semiconductor layer sequence via the electrical contacts during the entire method.

In a further method step, a voltage drop is measured at the environment sensor. In particular, the voltage drop is measured by means of the voltmeter of the measuring device.

In a further method step, a value of an environment parameter to be ascertained is assigned to the measured voltage drop. This is carried out in particular by means of the evaluation device.

For example, the measuring device is calibrated before carrying out the method. That is to say, the voltage drop at the environment sensor is measured in the case of a known environment parameter. This value pair made up of voltage drop and value of the environment parameter is stored, for example, in a memory of the evaluation device. This is repeated in particular for a plurality of values of the environment parameter. During the method for operating the measuring device, for example, these stored value pairs are then used to determine the value of the environment parameter from the measured voltage drop.

According to at least one embodiment of the method or one of its above-described embodiments, a change of the at least one environment parameter causes a change of the index of refraction of the sheath of the environment sensor. This change of the index of refraction causes a change of electrical losses within the semiconductor layer sequence. This takes place in particular because the condition for total reflection at a boundary surface between the semiconductor layer sequence and the sheath changes. In addition, a part of the totally-reflected radiation penetrates into the sheath, for example, in the form of an evanescent field, due to which the change of the index of refraction of the sheath has an influence on the laser mode in the semiconductor layer sequence. The change of losses within the semiconductor layer sequence causes a change of the measured voltage drop due to a change of the electrical resistance of the environment sensor. If higher losses occur within the semiconductor layer sequence due to the change of the index of refraction of the sheath, for example, the environment sensor thus has to be operated at a higher electrical power. The voltage drop thus increases due to the constant amperage.

A change of the at least one environment parameter is ascertained from the change of the measured voltage drop. It is thus possible not only to ascertain a constant value of an environment parameter, but also a change of the value.

According to at least one embodiment of the method or one of its abovementioned embodiments, a change of the index of refraction of the sheath causes a change of an amount of light emitted by the environment sensor. Due to the change of the index of refraction of the sheath, in particular the condition for total reflection at the boundary surface between the semiconductor layer sequence and the sheath changes, due to which the proportion of the radiation which is reflected because of total reflection at the boundary surface also changes. If, for example, the condition shifts in such a way that a smaller part of the entering radiation is totally reflected, a larger proportion of the radiation thus leaves the environment sensor in the direction perpendicular to the main axis. It is possible that the condition for total reflection changes in such a way that total reflection no longer occurs at all. In this case, the amount of light emitted by the environment sensor increases strongly. The amount of light can be registered, for example, by a human observer with the naked eye. The emitted amount of light represents, for example, an additional signal, on the basis of which a change of the environment parameter is recognizable. In particular, this signal is recognizable to a human observer with the naked eye.

Further advantages and advantageous designs and refinements of the environment sensor, the measuring device, and the method for operating a measuring device result from the exemplary embodiments described hereinafter in conjunction with the schematic drawings. Identical, equivalent, and identically acting elements are provided with identical reference signs in the figures. The figures and the size relationships of the elements shown in the figures to one another are not to scale in principle. Rather, individual elements can be shown exaggeratedly large for better illustration and/or for better comprehensibility.

DETAILED DESCRIPTION

Figure 1:
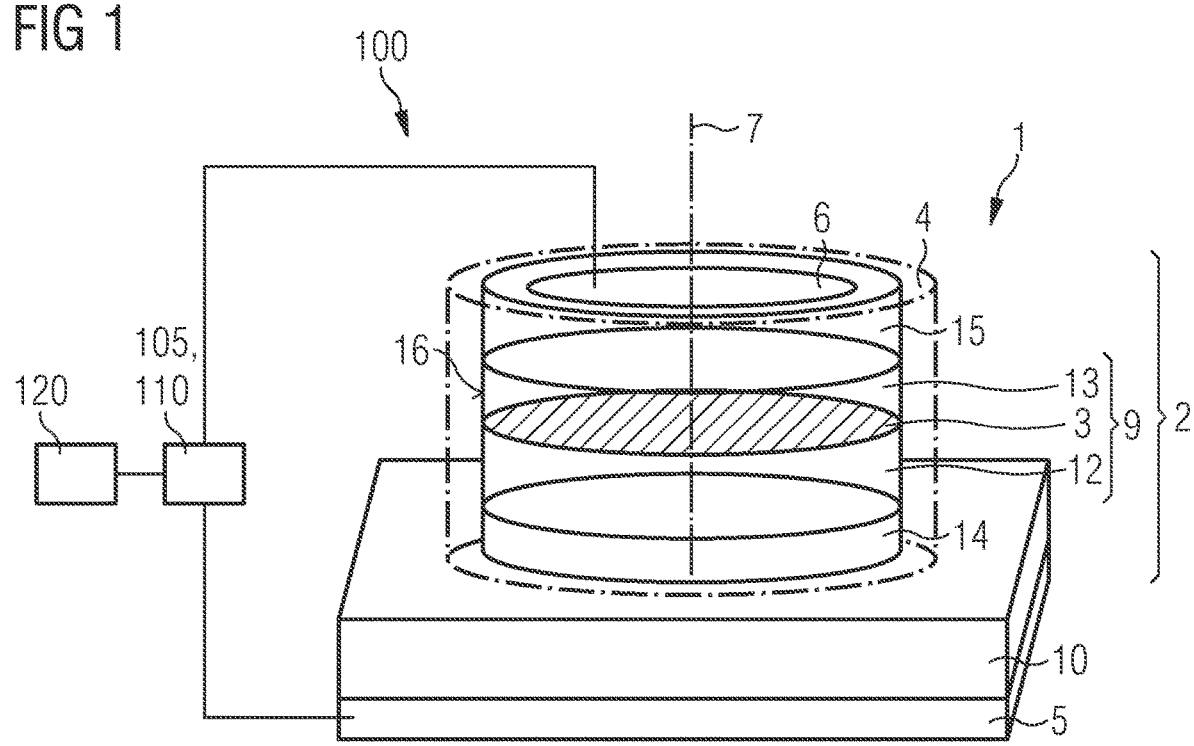
FIG. 1 shows an exemplary embodiment of a measuring device in a perspective view.

In the exemplary embodiment of the measuring device 100 of FIG. 1, an environment sensor 1 comprises a semiconductor layer sequence 2 having a mode-guiding area 9. The environment sensor 1 additionally comprises a sheath 4. The environment sensor 1 and the semiconductor layer sequence 2 each have the shape of a right circular cylinder having a main axis 7. The main axis 7 is in particular an axis of rotation symmetry of the environment sensor 1. The sheath 4 completely covers the semiconductor layer sequence 2 in directions perpendicular to the main axis 7. The sheath 4 has an index of refraction which changes as a function of an environment parameter of a medium surrounding the environment parameter 1. In particular, the sheath 4 is formed using a dielectric material, for example it consists completely of a dielectric material.

The semiconductor layer sequence 2, in particular the mode-guiding area 9, has an index of refraction which is greater than the index of refraction of the sheath 4. Due to the index of refraction difference between the semiconductor layer sequence 2 and the sheath 4, electromagnetic radiation propagates at a boundary surface 16 between the semiconductor layer sequence 2 and the sheath 4. In particular, electromagnetic radiation is totally reflected at the boundary surface 16 due to the index of refraction difference. The electromagnetic radiation is generated in the intended operation in the active zone 3. A laser mode 11 thus forms in the interior of the semiconductor layer sequence 2. The laser mode 11 is in particular indicated as a dashed line in FIG. 3. The index of refraction difference is, for example, $1 \times 10^{-3}$.

The semiconductor layer sequence 2 is based, for example, on a compound semiconductor material, such as InAlGaAs or InGaN. Examples of materials of the semiconductor layer sequence and the fundamental functionality which result in the formation of laser modes within the semiconductor layer sequence 2 are described, for example, in document DE 102015108529 A1.

The mode-guiding area 9 comprises the active layer 3 and a first waveguide 12 and a second waveguide 13. The active zone 3 is arranged between the waveguides 12, 13. The mode-guiding area 9 is arranged between a first cover layer 14 and a second cover layer 15. Electromagnetic radiation which is generated in the active zone 3 preferably only propagates in the mode-guiding area 9. For this purpose, the mode-guiding area 9 has, for example, an index of refraction, which is different from that of the first and second cover layer 14, 15. In particular, the cover layers 14, 15 each have a lower index of refraction than the mode-guiding area 9. The first waveguide 12 and the first cover layer 14 are in particular n-doped and the second waveguide 13 and the second cover layer 15 are in particular p-doped. Alternatively, the doping is selected in reverse, for example.

A substrate 10 is arranged on a surface of the first cover layer 14 facing away from the active zone 3. A first electrical contact is arranged in a side of the substrate 10 facing away from the semiconductor layer sequence 2. The first electrical contact 5 is in particular an n contact. The substrate 10 is preferably formed from a semiconductor material and is electrically conductive. For example, the substrate 10 comprises one of the following materials: Si, Ga, As. The growth substrate 10 is in particular a growth substrate for the semiconductor layer sequence 2.

A second electrical contact 6 is arranged on a surface of the second cover layer 15 facing away from the active zone 3. The second electrical contact 6 is in particular a p contact. The electrical contacts 5, 6 preferably comprise one of the following metals: Au, Pt, Ag, Al. The semiconductor layer sequence 2 is energized via the electrical contacts 5, 6 in the intended operation. For this purpose, the measuring device 100 comprises a current source 105, via which current is applied in such a way that laser modes are excited in the mode-guiding area 9. Furthermore, the measuring device 100 comprises a voltmeter 110, which is coupled to the environment sensor 1 and via which a voltage drop at the environment sensor 1 can be measured.

The measuring device 100 of FIG. 1 is suitable both for determining an environment parameter and for measuring a change of the environment parameter. Since the index of refraction of the sheath 4 is a function of the environment parameter, an electrical resistance of the environment sensor 1 is also a function of the environment parameter.

The reason for this is that a condition for total reflection at the boundary surface 16 is dependent on the index of refraction of the sheath 4. That is to say, it is determined via the index of refraction of the sheath 4 which proportion of the radiation generated in the active zone 3 is totally reflected at the boundary surface 16. Among other things, this proportion determines how large the radiation loss is within the semiconductor layer sequence 2 and thus at which power the environment sensor 1 has to be operated so that laser modes 11 may still be excited in the mode-guiding area 9. This in turn means that the electrical resistance of the environment sensor 1 is dependent on the radiation losses within the semiconductor layer sequence 2 and thus on the index of refraction of the sheath 4. The electrical resistance is thus in turn dependent on the environment parameter which is to be ascertained.

The electrical resistance of the environment sensor 1 may be ascertained via the voltage drop, which is measured via the voltmeter 110, since the current source 105 applies a constant current to the semiconductor layer sequence 2 via the operation of the measuring device. An evaluation device 120 connected to the voltmeter 110 ascertains the value of the environment parameter from the voltage drop.

Since a change of the environment parameter causes a change of the index of refraction of the sheath 4, a changed voltage drop is measured at the environment sensor 1 for the reasons just described. A change of the environment parameter may thus be ascertained by means of the evaluation device 120.

For example, the sheath 4 comprises bromophenol blue. In this case, the index of refraction of the sheath 4 is a function of the pH value of the environment. A pH value measurement can thus be carried out using the measuring device 100.

Figure 2:
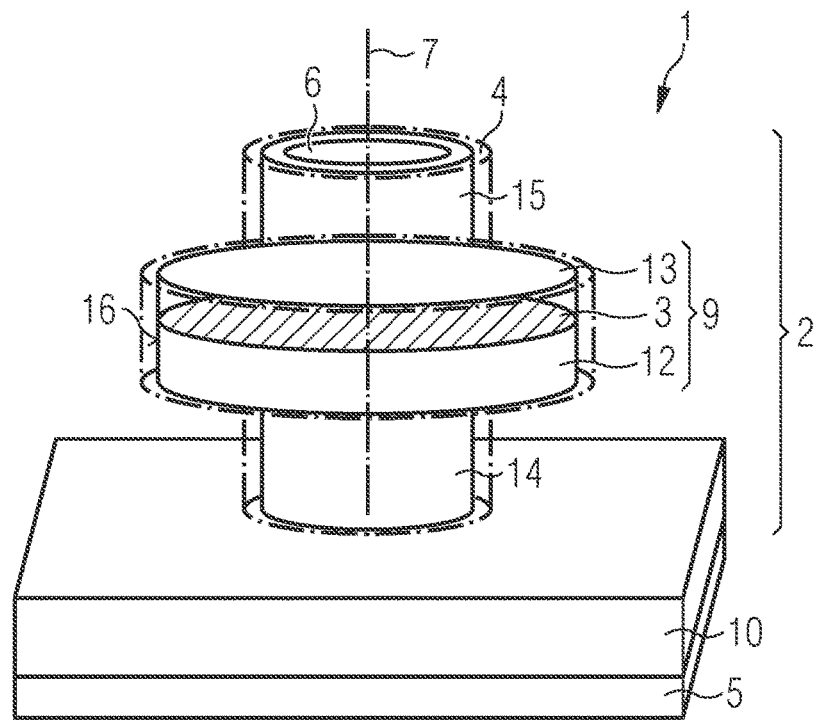
FIGS. 2 to 5 show exemplary embodiments of an environment sensor in various views.

The exemplary embodiment of the environment sensor 1 of FIG. 2 has essentially the same features as the environment sensor 1 of FIG. 1 with the difference that the mode-guiding area 9 has a greater extension perpendicular to the main axis 7 than the other areas of the semiconductor layer sequence 2. The other areas of the semiconductor layer sequence 2 are formed in particular by the first and second cover layer 14, 15.

Figure 3:
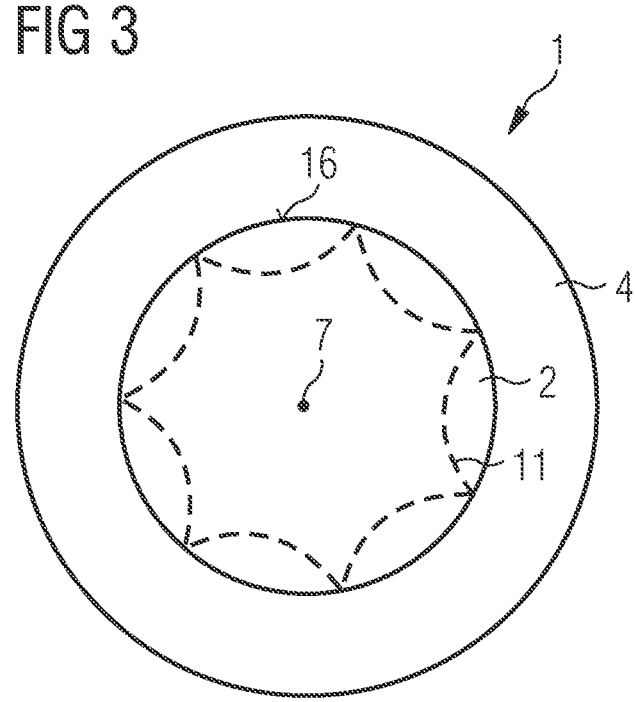

FIG. 3 shows a cross section perpendicular to a main axis 7 of an environment sensor 1. The plane of section extends in particular through the active zone 3. The environment sensor 1 is, for example, an environment sensor 1 according to one of FIGS. 1 and 2. It is indicated in FIG. 3 how laser modes 11 form in the semiconductor layer sequence 2 due to total reflection at the boundary surface 16.

Figure 4:
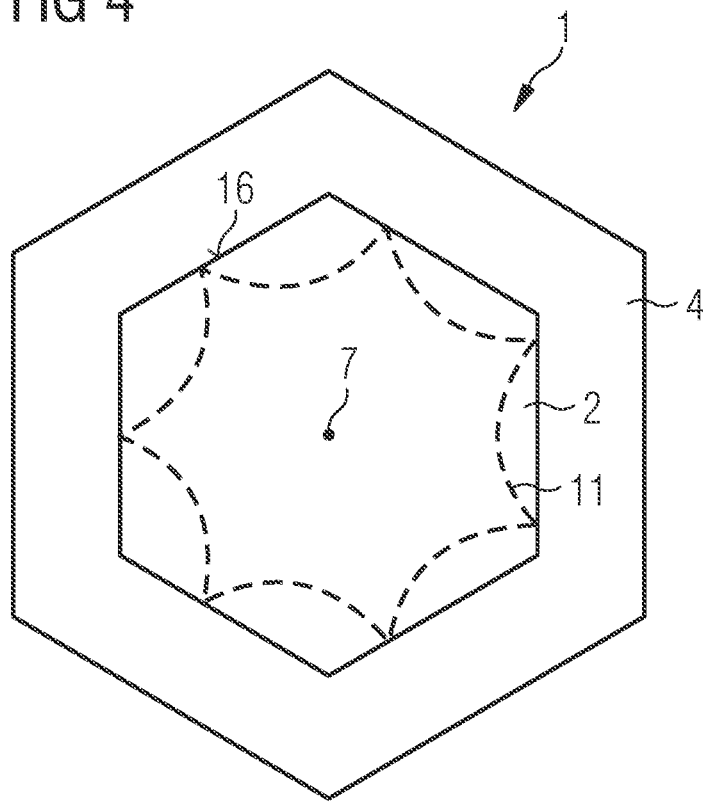

The exemplary embodiment of FIG. 4 shows essentially the same features as the exemplary embodiments of FIGS. 1 to 3, with the difference that the semiconductor layer sequence 2 and the environment sensor 1 have the shape of a prism. In the cross section of FIG. 4, this is apparent because the semiconductor layer sequence 2 and the environment sensor 1 have the shape of a hexagon. The semiconductor layer sequence 2 is based in this case, for example, on the material system InGaN. An environment sensor 1 having a hexagon as the base surface may be produced particularly easily due to a crystal structure of this material system.

Figure 5:
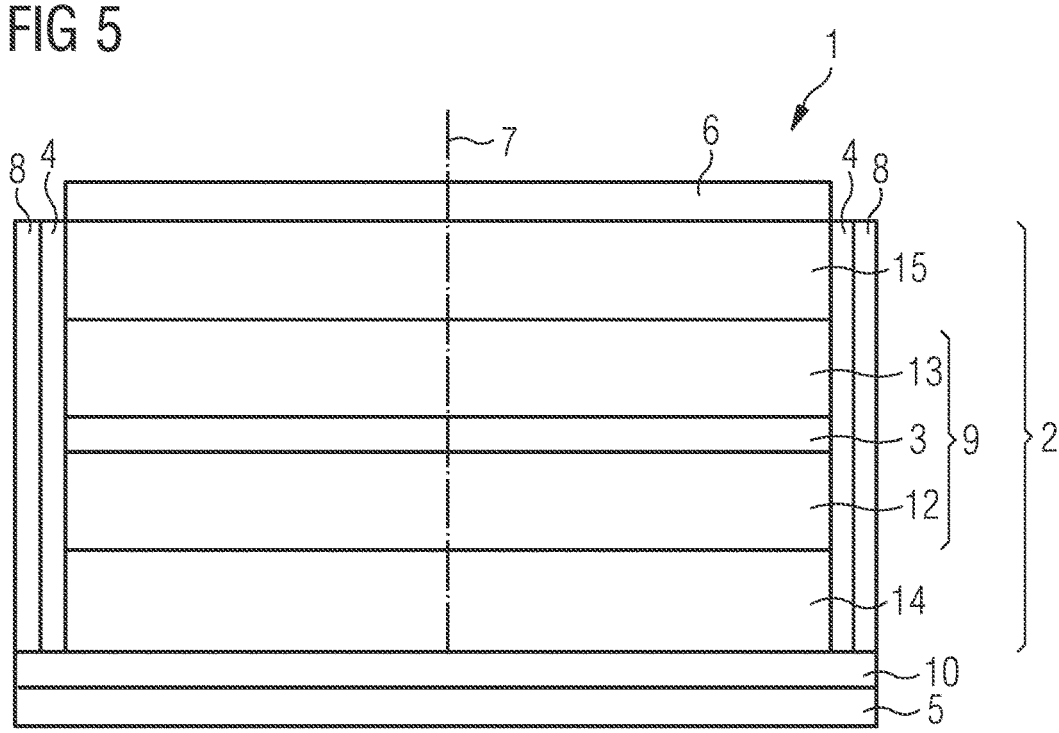

FIG. 5 shows an environment sensor 1 in a sectional view, wherein the plane of section extends in parallel to and along the main axis 7. The environment sensor 1 of FIG. 5 has essentially the same features as the environment sensor 1 of FIG. 1 with the difference that a passivation layer 8 is provided. The passivation layer 8 is arranged on a side of the sheath 4 facing away from the semiconductor layer sequence 2. In particular, this side of the sheath 4 is completely covered by the passivation layer 8. Such an environment sensor 1 can be used, for example, to ascertain a light intensity of the environment or a magnetic field strength. Preferably, the passivation layer 8 is transmissive to magnetic fields and/or electromagnetic fields for this purpose. This means that the physical properties of these fields are influenced insignificantly or not at all by the passivation layer 8. The passivation layer 8 additionally protects the sheath 4 and is made, for example, of silicon oxide. A passivation layer 8 can also be provided in all other exemplary embodiments of the environment sensor 1.

Figure 6:
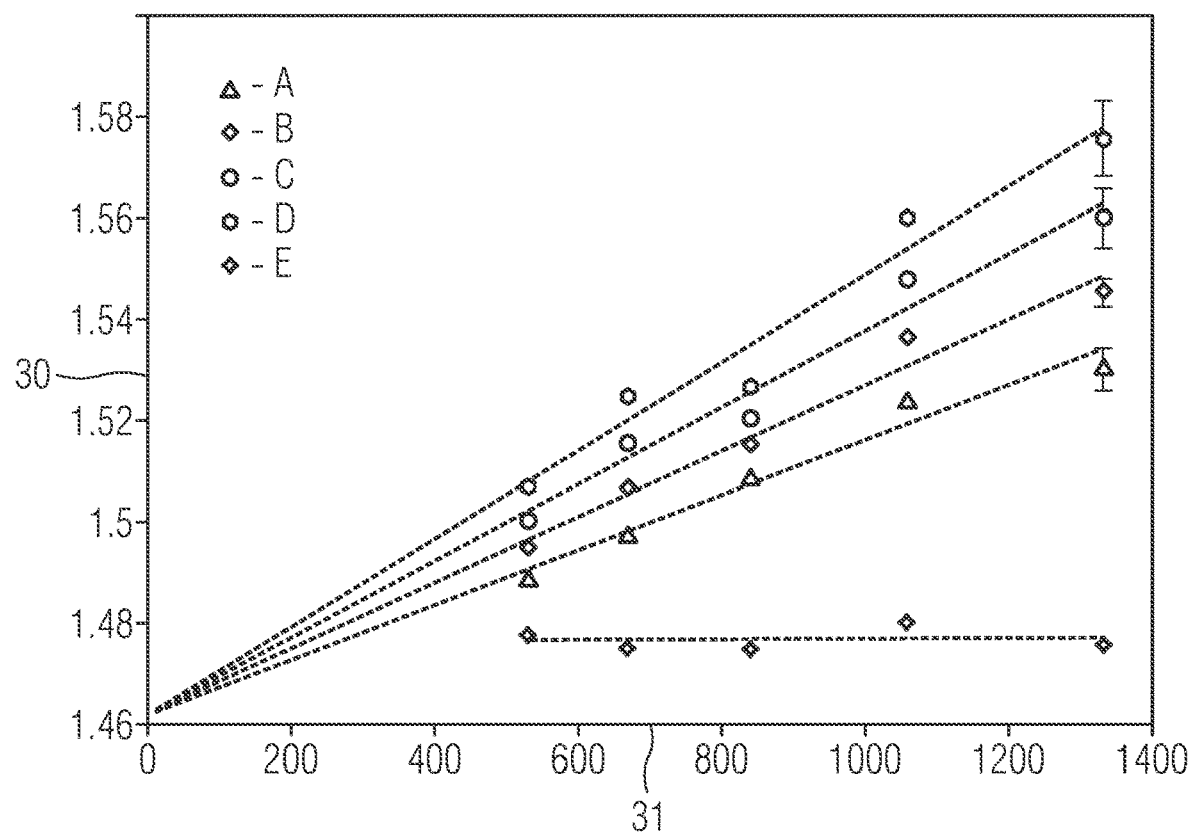
FIGS. 6 and 7 show the dependence of the index of refraction on a material in each case as a function of an environment parameter.

FIG. 6 shows an index of refraction 30 of $Fe_3O_4$ ferrofluid as a function of a light output 31 in µW at various magnetic field strengths 32 (curves A to E). FIG. 6, like FIG. 7 mentioned below, is taken from the document M. G. Shlyagin et al., Int. J. for Light and Elec. Opt. 186, 418-422, 2019, the contents of the disclosure of which are hereby incorporated by reference. In curve A, the magnetic field strength 32 is 40 Oe, in curve B it is 70 Oe, in curve C it is 100 Oe, in curve D it is 130 Oe, and in curve E it is 0 Oe. The magnetic field strengths 32 is specified in Oersted (Oe) in the cgs unit system.

FIG. 6 illustrates, on the one hand, that with increasing light output 31 or light intensity, the index of refraction 30 of $Fe_3O_4$ ferrofluid increases if a magnetic field is applied. On the other hand, in this case the index of refraction 30 is essentially a linear function of the light output 31.

Figure 7:
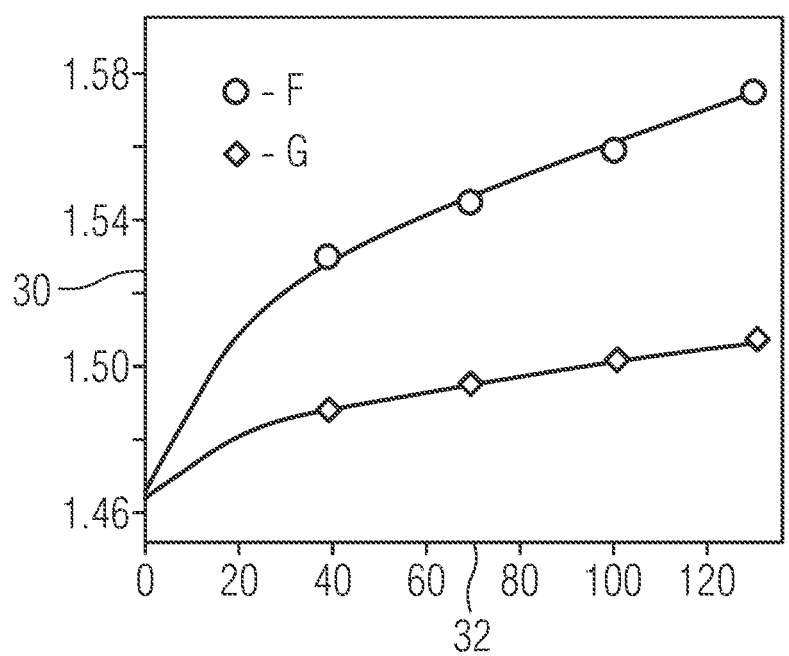

FIG. 7 illustrates the index of refraction 30 of $Fe_3O_4$ ferrofluid as a function of a magnetic field strength 32 in Oe (cgs unit system) for two light outputs 31 (curves F and G). FIG. 7 is taken, like FIG. 6, from the document of M. G. Shlyagin et al. It is apparent that the index of refraction 30 increases at constant light output 31 with increasing magnetic field strength 32. Furthermore, in a range of the magnetic field strength 32 from 40 Oe to 120 Oe, the functional relationship between magnetic field strength 32 and index of refraction 30 is linear.

Therefore, using $Fe_3O_4$ ferrofluid as the material for the sheath 4, an environment sensor 1 can be implemented for ascertaining light output 31 or light intensity and/or magnetic field strength 32.

The components shown in the figures, if not indicated otherwise, preferably follow one another directly in the indicated sequence. Layers that do not touch in the figures are preferably spaced apart from one another. If lines are shown in parallel to one another, the corresponding surfaces are preferably also aligned in parallel to one another. Likewise, if not indicated otherwise, the relative positions of the components shown are represented realistically in relation to one another in the figures.

The invention is not restricted to the exemplary embodiments by the description on the basis thereof. Rather, the invention comprises every novel feature and every combination of features, which includes in particular every combination of features in the claims, even if this feature or this combination is not explicitly specified in the claims or exemplary embodiments.

The invention claimed is:

1. An environment sensor for sensing at least one environment parameter, comprising:
a semiconductor layer sequence, which is configured to form laser modes within the environment sensor;
a sheath, the index of refraction of which changes as a function of the environment parameter; and
a first electrical contact and a second electrical contact for energizing the semiconductor layer sequence, wherein the semiconductor layer sequence has the shape of a general cylinder having a main axis,
the semiconductor layer sequence is at least partially covered by the sheath in directions perpendicular to the main axis,
the semiconductor layer sequence has an index of refraction which is greater than the index of refraction of the sheath,
the environment sensor is configured in such a way that in its intended operation, a change of the index of refraction of the sheath causes a change of the electrical resistance of the semiconductor layer sequence due to a change of the radiation losses within the semiconductor layer sequence, and
a change of the at least one environment parameter causes a change of the index of refraction of the sheath of the environment sensor.

2. The environment sensor as claimed in claim 1, in which the environment parameter is one of the following parameters: temperature, pressure, humidity, light intensity, magnetic field strength, pH value.

3. The environment sensor as claimed in claim 1, wherein the sheath comprises at least one of the following materials: bromophenol blue, polyvinyl alcohol, $Fe_3O_4$ ferrofluid, lithium niobate, AlGaN.

4. The environment sensor as claimed in claim 1, wherein the functional relationship between the index of refraction of the sheath and the at least one environment parameter is linear.

5. The environment sensor as claimed in claim 1, wherein a side of the sheath facing away from the semiconductor layer sequence directly borders the environment to be monitored.

6. The environment sensor as claimed in claim 1, wherein a passivation layer is arranged on a side of the sheath facing away from the semiconductor layer sequence.

7. The environment sensor as claimed in claim 1, wherein the sheath has a thickness of at least 1 nm and at most 1 µm.

8. The environment sensor as claimed in claim 1, wherein the semiconductor layer sequence has the shape of a prism.

9. The environment sensor as claimed in claim 1, wherein the environment sensor has an extension of at most 20 µm perpendicular to the main axis.

10. The environment sensor as claimed in claim 1, wherein
the semiconductor layer sequence comprises a mode-guiding area,
the mode-guiding area contains an active zone of the semiconductor layer sequence, and
the mode-guiding area is spaced apart in each case from the first electrical contact and the second electrical contact.

11. The environment sensor as claimed in claim 10, wherein
the mode-guiding area has a greater extension in directions perpendicular to the main axis than the rest of the semiconductor layer sequence.

12. The environment sensor as claimed in claim 1, wherein
the environment sensor includes a substrate,
the substrate is arranged between the semiconductor layer sequence and the first electrical contact,
the substrate is formed from an electrically conductive material.

13. A measuring device for ascertaining the value of at least one environment parameter, comprising:
an environment sensor as claimed in claim 1,
a current source, which is configured to apply a constant current to the semiconductor layer sequence via the electrical contacts,
a voltmeter, which is coupled to the environment sensor and is configured to measure an electrical voltage drop at the environment sensor,
an evaluation device, which is configured to assign a voltage drop measured by the voltmeter to the value of the environment parameter to be ascertained.

14. A method for operating a measuring device as claimed in claim 13, in which
a constant current is applied to the environment sensor, which causes a generation of laser modes in the semiconductor layer sequence,
a voltage drop at the environment sensor is measured,
a value of an environment parameter to be ascertained is assigned to the measured voltage drop.

15. The method as claimed in claim 14, wherein
the change of the index of refraction of the sheath causes a change of electrical losses within the semiconductor layer sequence,
the change of electrical losses within the semiconductor layer sequence causes a change of the measured voltage drop, or
a change of the at least one environment parameter is ascertained from the change of the measured voltage drop.

16. The method as claimed in claim 14, wherein a change of the index of refraction of the sheath causes a change of an amount of light emitted by the environment sensor.

* * * * *